(12) United States Patent
Cao et al.

(10) Patent No.: US 11,919,802 B2
(45) Date of Patent: Mar. 5, 2024

(54) ELECTRONIC-GRADE GLASS FIBER COMPOSITION, AND GLASS FIBER AND ELECTRONIC FABRIC THEREOF

(71) Applicant: JUSHI GROUP CO., LTD., Tongxiang (CN)

(72) Inventors: Guorong Cao, Tongxiang (CN); Wenzhong Xing, Tongxiang (CN); Lin Zhang, Tongxiang (CN); Zhonghua Yao, Tongxiang (CN); Hongya Zhou, Tongxiang (CN)

(73) Assignee: JUSHI GROUP CO., LTD., Tongxiang (CN)

( * ) Notice: Subject to any disclaimer, the term of this patent is extended or adjusted under 35 U.S.C. 154(b) by 831 days.

(21) Appl. No.: 16/979,089

(22) PCT Filed: Oct. 30, 2019

(86) PCT No.: PCT/CN2019/114268
§ 371 (c)(1),
(2) Date: Sep. 8, 2020

(87) PCT Pub. No.: WO2021/056680
PCT Pub. Date: Apr. 1, 2021

(65) Prior Publication Data
US 2023/0150866 A1    May 18, 2023

(30) Foreign Application Priority Data
Sep. 25, 2019 (CN) .......................... 201910912829.1

(51) Int. Cl.
| | | |
|---|---|---|
| C03C 13/00 | (2006.01) | |
| C03C 3/118 | (2006.01) | |
| C03C 4/16 | (2006.01) | |
| C03C 13/06 | (2006.01) | |
| H05K 1/03 | (2006.01) | |

(52) U.S. Cl.
CPC .............. *C03C 13/00* (2013.01); *C03C 3/118* (2013.01); *C03C 4/16* (2013.01); *C03C 13/06* (2013.01); *H05K 1/0306* (2013.01); *C03C 2204/00* (2013.01); *C03C 2213/00* (2013.01); *H05K 2201/029* (2013.01)

(58) Field of Classification Search
CPC ................................. C03C 13/00; C03C 13/06
See application file for complete search history.

(56) References Cited

U.S. PATENT DOCUMENTS

| | | | |
|---|---|---|---|
| 6,818,575 B2 | 11/2004 | Wallenberger | |
| 7,829,490 B2 | 11/2010 | Li et al. | |
| 7,989,375 B2 | 8/2011 | Tanaka | |
| 8,334,228 B2 | 12/2012 | Zhang et al. | |
| 10,407,342 B2 | 9/2019 | Mcginnis et al. | |
| 11,059,946 B2 * | 7/2021 | Tsuchigane | C03C 3/087 |
| 2005/0107238 A1 * | 5/2005 | Li | C03C 3/091 |
| | | | 501/70 |
| 2008/0146430 A1 | 6/2008 | Li et al. | |
| 2009/0286440 A1 | 11/2009 | Lecomte et al. | |
| 2019/0315650 A1 | 10/2019 | Fujiwara | |
| 2020/0079919 A1 * | 3/2020 | Tsuchigane | C03C 3/118 |

FOREIGN PATENT DOCUMENTS

| | | |
|---|---|---|
| CN | 1392870 A | 1/2003 |
| CN | 1688515 A | 10/2005 |
| CN | 101198559 A | 6/2008 |
| CN | 101503279 A | 8/2009 |
| CN | 101558019 A | 10/2009 |
| CN | 109797485 A | 5/2019 |
| EP | 0186077 A2 | 7/1986 |
| EP | 3539934 A1 | 9/2019 |
| JP | S573736 A | 1/1982 |
| JP | S573737 A | 1/1982 |
| JP | 660264345 A | 12/1985 |
| JP | S61155227 A | 7/1986 |
| JP | S62162649 A | 7/1987 |
| JP | H07157975 A | 6/1995 |
| JP | 2004508265 A | 3/2004 |
| JP | 2010513187 A | 4/2010 |

(Continued)

OTHER PUBLICATIONS

The State Intellectual Property Office of People's Republic of China First Office Action for Application No. CN201910912829.1 dated Aug. 17, 2021 17 pages (with translation).
European Patent Office European Search Report for Application No. EP19915587 dated Oct. 14, 2021 9 pages.
Frederick T. Wallenberger, et al. "The effect of boron on the properties of fibreglass melts" Proc. Fifth Int. Conf on Borate Glasses, Crystals and Melts, Glass Tech.: Eur.J. Glass Sci. Technol. A, Oct. 2006, 47(5), 148-152.
Japan Patent Office The Office Action for Application No. JP2020-551427 dated Dec. 21, 2021 8 pages (with translation).
Federal Institute of Industrial Property Official Action of the Substantive Examination for Application No. RU2021121904/03(045837) dated Dec. 16, 2021 18 pages (with translation).

*Primary Examiner* — Elizabeth A. Bolden

(74) *Attorney, Agent, or Firm* — ANOVA LAW GROUP, PLLC

(57) ABSTRACT

An electronic-grade glass fiber composition includes the following components with corresponding amounts by weight percentages 51.0-57.5% $SiO_2$, 11.0-17.0% $Al_2O_3$, >4.5% and ≤6.4% $B_2O_3$, 19.5-24.8% CaO, 0.1-1.9% MgO, 0.05-1.2% $R_2O=Na_2O+K_2O+Li_2O$, 0.05-0.8% $Fe_2O_3$, 0.01-1.0% $TiO_2$, and 0.01-1.0% $F_2$. A weight percentage ratio $C1=SiO_2/B_2O_3$ is 8.1-12.7, a weight percentage ratio $C2=B_2O_3/(R_2O+MgO)$ is 1.7-6.3, and a total weight percentage of the above components is greater than or equal to 99%.

20 Claims, No Drawings

(56) References Cited

FOREIGN PATENT DOCUMENTS

| | | |
|---|---|---|
| RU | 2478585 C2 | 4/2013 |
| RU | 2531950 C2 | 10/2014 |
| WO | 2012037205 A1 | 3/2012 |
| WO | 2017171101 A1 | 10/2017 |
| WO | 2018088488 A1 | 5/2018 |

* cited by examiner

ELECTRONIC-GRADE GLASS FIBER COMPOSITION, AND GLASS FIBER AND ELECTRONIC FABRIC THEREOF

CROSS-REFERENCE TO RELATED APPLICATIONS

The present application is a national stage entry under 35 U.S.C. § 371 of International Application No. PCT/CN2019/114268, filed on Oct. 30, 2019, which claims priority to Chinese Application No. 201910912829.1, filed on Sep. 25, 2019 and entitled "Electronic-grade glass fiber composition, and glass fiber and electronic fabric thereof," disclosures of both of which are incorporated herein by reference in their entireties.

TECHNICAL FIELD

The disclosure relates to a glass fiber composition, in particular, to electronic-grade glass fiber compositions used in the electronic industry, and to a glass fiber and electronic fabric thereof.

BACKGROUND

Glass fiber is an inorganic fiber material. As a functional base material for electronic industry, electronic-grade glass fiber is mainly used in such fields as communications, computer, IC packaging, consumer electronics, automotive electronics, etc. The industrial chain of "electronic glass fiber, electronic fabric, copper clad plate and printed circuit board (PCB)" is the core application of electronic glass fiber. In order to meet the dielectric properties of PCB, electronic-grade glass fiber is required to have good dielectric properties.

At present, the electronic-grade glass fiber for PCB both at home and abroad is mainly D-glass fiber having a high boron content, and conventional E-glass fiber. D-glass fiber is a low dielectric glass fiber, its dielectric properties are better than that of conventional E-glass fiber, and it can meet the requirements of high-density and high-rate information processing. D-glass fiber mainly comprises 20-25% $B_2O_3$, 72-76% $SiO_2$, 0-5% $Al_2O_3$ and 2-4% $Na_2O+K_2O$, as expressed in percentage by weight. The dielectric constant of D-glass fiber (1 MHz at room temperature) is below 4.5, but it is difficult to melt and draw D-glass fiber. For example, its forming temperature is more than 1400° C., which is difficult to realize a large-scale tank furnace production. At the same time, the drilling performance and water resistance of the D-glass fiber products are poor, which is unfavorable for subsequent processing and using. It also has the disadvantage of a high cost of raw materials.

As common electronic-grade glass fiber, the conventional E-glass fiber having a high boron content is the main commercial electronic glass fiber at present. The dielectric constant of conventional E-glass fiber is generally 6.7-7.1 at 1 MHz at room temperature, which can meet the requirements of conventional printed circuit boards, and conventional E glass fiber has the advantage of good melting performance and excellent processability. However, in practice, the $B_2O_3$ content of conventional E-glass fiber produced by various companies is generally 7.2%, with a deviation of ±0.4%, so the raw materials are still costly. Moreover, the presence of a large number of boron in raw materials leads to a high volatility of the batch, which is easy to accelerate the high-temperature corrosion of the refractories for the furnace. Besides, the conventional E-glass fiber has other disadvantages, such as poor mechanical properties and unsatisfactory water resistance.

In addition, the main focus of general-purpose glass fiber for reinforcement is mechanical properties and corrosion resistance. Take boron-free E-glass fiber as an example. Its composition is free of boron, or even free of fluorine at the same time, and the total amount of alkali metal and alkaline earth metal oxides will have to be increased, so as to reduce the viscosity and melting difficulty of glass. Thus the production difficulty will be lowered while the production efficiency will be raised. As a result, it is difficult for the electrical properties of boron-free E glass fiber and the drilling performance of the glass fiber boards to meet the requirements of PCB, so the boron-free E-glass fiber is not suitable for producing electronic-grade glass fiber.

At present, many glass fiber enterprises and research institutions focus on the research and development of low dielectric glass fiber, while the research and innovation on electronic-grade E-glass fiber is very scarce. Practically, there are many problems in the conventional electronic-grade E-glass fiber. In terms of improving glass properties, reducing costs, decreasing volatilization, and improving temperature range for fiber formation, there still remains significant potential of improvement for the conventional electronic-grade E-glass fiber.

SUMMARY

In order to solve the problems described above, the present disclosure aims to provide an electronic-grade glass fiber composition. The composition can reduce the cost and volatilization of raw materials and lower corrosion to refractories. It can also improve dielectric properties of the glass, increase mechanical properties and water resistance, and improve temperature range for fiber formation. The composition is suitable for large-scale tank furnace production.

In accordance with one aspect of the present disclosure, there is provided an electronic-grade glass fiber composition, the composition comprising percentage amounts by weight of the following components:

| | |
|---|---|
| $SiO_2$ | 51.0-57.5% |
| $Al_2O_3$ | 11.0-17.0% |
| $B_2O_3$ | >4.5% and ≤6.4% |
| CaO | 19.5-24.8% |
| MgO | 0.1-1.9% |
| $R_2O = Na_2O + K_2O + Li_2O$ | 0.05-1.2% |
| $Fe_2O_3$ | 0.05-0.8% |
| $TiO_2$ | 0.01-1.0% |
| $F_2$ | 0.01-1.0% | wherein, the range of the weight percentage ratio $C1=SiO_2/B_2O_3$ is 8.1-12.7, the range of the weight percentage ratio $C2=B_2O_3/(R_2O+MgO)$ is 1.7-6.3, and the total weight percentage of the above components is greater than or equal to 99%.

In a class of this embodiment, the range of the weight percentage ratio $C3=(SiO_2+Al_2O_3)/(B_2O_3+MgO)$ is 9.0-15.0.

In a class of this embodiment, the range of the weight percentage ratio $C4=CaO/(CaO+MgO)$ is greater than or equal to 0.915.

In a class of this embodiment, the content range of $R_2O$ is 0.1-0.8% in percentage amounts by weight.

In a class of this embodiment, the content range of MgO is 0.45-1.9% in percentage amounts by weight.

In a class of this embodiment, the content range of $B_2O_3$ is 4.55-6.1% in percentage amounts by weight.

In a class of this embodiment, the content range of $F_2$ is 0.3-1.0% in percentage amounts by weight.

In a class of this embodiment, the content range of $Li_2O$ is less than 0.1% in percentage amounts by weight.

In a class of this embodiment, the combined content range of $B_2O_3+MgO$ is 5.0-7.6% in percentage amounts by weight.

In a class of this embodiment, the combined content range of $SiO_2+Al_2O_3$ is 68.5-74.0% in percentage amounts by weight.

In a class of this embodiment, the combined content range of $CaO+MgO+R_2O$ is 20.5-25.8% in percentage amounts by weight.

In a class of this embodiment, the content range of CaO is 22.2-24.8% in percentage amounts by weight.

In a class of this embodiment, the composition comprises the following components expressed as percentage amounts by weight:

| | |
|---|---|
| $SiO_2$ | 51.0-57.5% |
| $Al_2O_3$ | 11.0-17.0% |
| $B_2O_3$ | >4.5% and ≤6.4% |
| CaO | 19.5-24.8% |
| MgO | 0.1-1.9% |
| $R_2O = Na_2O + K_2O + Li_2O$ | 0.05-1.2% |
| $Fe_2O_3$ | 0.05-0.8% |
| $TiO_2$ | 0.01-1.0% |
| $F_2$ | 0.01-1.0% | wherein, the range of the weight percentage ratio $C1=SiO_2/B_2O_3$ is 8.1-12.7, the range of the weight percentage ratio $C2=B_2O_3/(R_2O+MgO)$ is 1.7-6.3, the range of the weight percentage ratio $C3=(SiO_2+Al_2O_3)/(B_2O_3+MgO)$ is 9.0-15.0, the range of the weight percentage ratio $C4=CaO/(CaO+MgO)$ is greater than or equal to 0.915, and the total weight percentage of the above components is greater than or equal to 99%.

In a class of this embodiment, the composition comprises the following components expressed as percentage amounts by weight:

| | |
|---|---|
| $SiO_2$ | 52.0-57.0% |
| $Al_2O_3$ | 12.0-16.0% |
| $B_2O_3$ | >4.5% and ≤6.4% |
| CaO | 20.0-24.4% |
| MgO | 0.1-1.9% |
| $R_2O = Na_2O + K_2O + Li_2O$ | 0.05-1.2% |
| $Fe_2O_3$ | 0.05-0.8% |
| $TiO_2$ | 0.01-1.0% |
| $F_2$ | 0.01-1.0% | wherein, the range of the weight percentage ratio $C1=SiO_2/B_2O_3$ is 8.3-12.5, the range of the weight percentage ratio $C2=B_2O_3/(R_2O+MgO)$ is 1.7-6.3, and the total weight percentage of the above components is greater than or equal to 99%.

In a class of this embodiment, the composition comprises the following components expressed as percentage amounts by weight:

| | |
|---|---|
| $SiO_2$ | 52.0-57.0% |
| Al2O3 | 12.0-16.0% |
| B2O3 | >4.5% and <6.4% |
| CaO | 20.0-24.4% |
| MgO | 0.1-1.9% |
| R2O=Na2O+K2O+Li2O | 0.05-0.95% |
| Fe2O3 | 0.05-0.8% |
| TiO2 | 0.05-0.8% |
| F2 | 0.05-0.8% | wherein, the range of the weight percentage ratio $C1=SiO_2/B_2O_3$ is 8.3-12.5, the range of the weight percentage ratio $C2=B_2O_3/(R_2O+MgO)$ is 1.7-6.3, the range of the weight percentage ratio $C3=(SiO_2+Al_2O_3)/(B_2O_3+MgO)$ is 9.0-15.0, the range of the weight percentage ratio $C4=CaO/(CaO+MgO)$ is greater than or equal to 0.915, and the total weight percentage of the above components is greater than or equal to 99%.

In a class of this embodiment, the composition contains one or more components selected from the group consisting of $SO_3$, SrO, $CeO_2$, $La_2O_3$, $Y_2O_3$, $ZrO_2$ and ZnO, with the combined weight percentage of the one or more components being less than 1%.

According to another aspect of this disclosure, an electronic-grade glass fiber produced with the electronic-grade glass fiber composition is provided.

Preferably, the electronic-grade glass fiber has a dielectric constant range of 6.3-7.0 at 1 MHz at room temperature.

According to yet another aspect of this disclosure, an electronic fabric including the electronic-grade glass fiber is provided.

Preferably, the electronic fabric is used as a base material for printed circuit boards.

The electronic-grade glass fiber composition according to the present disclosure specifically relates to an electronic-grade glass fiber composition that has high cost performance. The content ratios of $SiO_2/B_2O_3$ and $B_2O_3/(R_2O+MgO)$ are controlled by mainly adjusting the contents of $SiO_2$, $Al_2O_3$, $B_2O_3$ and $F_2$, and also adjusting the contents of alkali metal oxides and alkali earth metal oxides, as well as the total content thereof. Further, the synergistic effects between the group of silicon ions, boron ions and aluminum ions, and the group of alkali metal ions and alkaline earth metal ions are improved by controlling the ratios of $(SiO_2+Al_2O_3)/(B_2O_3+MgO)$ and $CaO/(CaO+MgO)$, etc. Through the control of aforementioned component contents and ratios, not only the cost and volatilization of raw materials can be reduced, but also dielectric properties of the glass can be improved, mechanical properties and water resistance can be improved, and temperature range for fiber formation can be improved, so as to increase production efficiency. The composition is suitable for large-scale tank furnace production.

Specifically, the electronic-grade glass fiber composition according to the present disclosure comprises the following components expressed as percentage amounts by weight:

| | |
|---|---|
| $SiO_2$ | 51.0-57.5% |
| Al2O3 | 11.0-17.0% |
| B2O3 | >4.5% and <6.4% |
| CaO | 19.5-24.8% |
| MgO | 0.1-1.9% |
| R2O=Na2O+K2O+Li2O | 0.05-1.2% |
| Fe2O3 | 0.05-0.8% |
| TiO2 | 0.01-1.0% |
| F2 | 0.01-1.0% | wherein, the range of the weight percentage ratio $C1=SiO_2/B_2O_3$ is 8.1-12.7, the range of the weight percentage ratio C2=$B_2O_3$/($R_2O$+MgO) is 1.7-6.3, and the total weight percentage of the above components is greater than or equal to 99%.

The effect and content of each component in the electronic-grade glass fiber composition is described as follows:

As a glass network former oxide of glass, $SiO_2$ is a main oxide forming the glass network and can hardly move under the influence of electric field. In the electronic-grade glass fiber composition of the present disclosure, the content range of $SiO_2$ is 51.0-57.5% by weight. Preferably, the weight percentage range of $SiO_2$ can be 52.0-57.5%, more preferably 52.0-57.0%, and still more preferably 53.0-56.5%. In another embodiment of this disclosure, the weight percentage range of $SiO_2$ can be 54.2-57.5% and the weight percentage range of $F_2$ can be 0.3-1.0%.

$B_2O_3$ is a network forming oxide of the glass. It can improve many properties of the glass and also has good fluxing effect. At the same time, boron can be present in the form of [$BO_3$] triangles and/or [$BO_4$] tetrahedrons under different conditions. At high melting temperatures, it is difficult to form [$BO_4$] tetrahedrons, and [$BO_3$] triangles will be formed, which is the main reason why $B_2O_3$ can reduce the glass viscosity at high temperatures; at low temperatures, $B^{3+}$ ions have the tendency to capture free oxygen to form boron oxygen tetrahedrons, which plays a role in network filling. And the volume of a [$BO_4$] tetrahedron is smaller than that of a [$SiO_4$] tetrahedron, which makes the glass structure tend to be more compact and thus helps to reduce the conductivity and dielectric constant of glass.

However, the price of boron-containing raw materials is very high. Moreover, boron is a volatile substance, and the presence of a large number of boron-containing raw materials leads to high volatility of the batch. This will accelerate high temperature corrosion to refractories of the furnace. Besides, the mechanical properties, acid resistance and water resistance of electronic-grade glass fiber having a high boron content are poor.

In the electronic-grade glass fiber composition according to this disclosure, the weight percentage range of $B_2O_3$ can be greater than 4.5% and less than or equal to 6.4%. Preferably, the weight percentage range of $B_2O_3$ can be 4.55-6.4%, more preferably 4.55-6.1%, and even more preferably 4.7-6.1%. Besides, in another embodiment of this disclosure, the weight percentage range of $SiO_2$ is 52.0-55.9% and the weight percentage range of $B_2O_3$ is 5.1-6.4%.

$Al_2O_3$ is an intermediate oxide of the glass and also a main oxide forming the glass network. When combined with $SiO_2$, it can have a substantive effect on the mechanical properties of the glass and a significant effect on glass devitrification and water resistance. In the E-glass with a high boron content, due to the stronger tendency of $B^{3+}$ to combine with oxygen ions, the tetrahedral coordination of $Al^{3+}$ is disturbed under the influence of a large number of $B^{3+}$ ions with high field strength. Therefore, the ability of $Al^{3+}$ ions to capture free oxygen to form alumina tetrahedrons is weakened, and $Al^{3+}$ ions in the glass tend to be in the form of octahedrons. When the content of $B_2O_3$ is appropriately decreased, the tendency of $Al^{3+}$ to capture free oxygen and form alumina tetrahedrons can be enhanced, the effect of network filling can be strengthened, and the number of easily polarized non-bridging oxygen ions can be reduced. Thus, the dielectric constant of glass would be lowered.

In the electronic-grade glass fiber composition according to this disclosure, the weight percentage range of $Al_2O_3$ can be 11.0-17.0%, preferably 11.5-16.5%, and more preferably 12.0-16.0%.

While ensuring electrical properties of the glass, in order to increase cost performance of the products and take into account the melting and refining effect of the glass, the boron oxide content can be appropriately reduced and the quantities of network former and bridging oxygen in the glass can be adjusted, so that the competition between boron ions and silicon ions in capturing oxygen would be under control, the dielectric constant of the glass be would reduced, and the mechanical properties of the glass would be increased. In the electronic-grade glass fiber composition of this disclosure, the weight percentage ratio C1=$SiO_2$/$B_2O_3$ can be 8.1-12.7. Preferably, the weight percentage ratio C1 can be 8.3-12.7, more preferably can be 8.3-12.5, and even more preferably can be 8.5-12.5.

Alkali metal oxides are glass network modifiers, and such alkali metal oxides as $Na_2O$, $K_2O$ and $Li_2O$ can reduce glass viscosity and improve glass melting performance. They can also effectively provide free oxygen, form a good synergistic effect in combination with boron ions and aluminum ions, and generate a certain amount of tetrahedrons with negative charges. These tetrahedrons will play a role in restraining $Na^+$ ions by limiting their movement, and thus help produce a better structural stacking effect. However, alkali metal oxides have a significant effect on the electrical properties of glass. With the increase of alkali metal oxides in the glass, the amount of monovalent alkali metal ions as well as non-bridging oxygen ions that can easily polarize will increase, and the conductivity and dielectric constant of the glass will accordingly be raised.

According to the electronic-grade glass fiber composition of the present disclosure, we have found that the effect of $Na_2O$ on the electrical properties of glass is greater than that of $K_2O$ and $Li_2O$, which is related to the fact that $Na_2O$ is capable of providing non-bridging oxygen ions with high polarizability; meanwhile, the dual alkali effect is significant, as the conductivity of the glass containing both $K_2O$ and $Na_2O$ is lower than that of the glass containing only $Na_2O$.

In the electronic-grade glass fiber composition of this disclosure, the weight percentage of $R_2O$=$Na_2O$+$K_2O$+$Li_2O$ is 0.05-1.2%. Preferably, the weight percentage of $R_2O$ is 0.05-0.95%, more preferably 0.1-0.8%, and even more preferably 0.1-0.65%.

Furthermore, the weight percentage of $Na_2O$+$K_2O$ can be 0.05-0.95%, preferably 0.1-0.8%. Further, the weight percentage of $Na_2O$ can be 0.05-0.5%, preferably 0.05-0.35%. Further, the weight percentage of $K_2O$ can be 0.05-0.4%. Further, the weight percentage of $Li_2O$ can be less than 0.15%, preferably less than 0.1%. In addition, in another embodiment of this disclosure, the electronic-grade glass fiber composition according to this disclosure may be free of $Li_2O$. Furthermore, in order to improve the electrical properties of glass, the weight percentage ratio of $K_2O$/$Na_2O$ can be greater than or equal to 0.45, preferably greater than or equal to 0.60.

CaO is also a network modifier of the glass. It has the effect of regulating the viscosity of the glass and improving the chemical stability and mechanical strength of the glass. It also can help to reduce the hardening rate of molten glass and accelerate the fiberizing process of the glass. At the same time, having the similar ionic radius, the $Ca^{2+}$ and $Na^+$ ions are more likely to form cross filling in the gaps of glass structure. Moreover, with greater electric field strength than that of $Na^+$ ions, the $Ca^{2+}$ ions filling in the glass vacancies are more capable of blocking the ion migration channels. So Ca²⁺ ions can effectively inhibit the migration of Na⁺ ions and thus lower the conductivity and dielectric constant of glass.

In the electronic-grade glass fiber composition according to this disclosure, the weight percentage range of CaO can be 19.5-24.8%. Too low of a content would not generate an excellent effect mentioned above; if the content is too high, the amount of non-bridging oxygen ions in the glass will be too high, leading to the increase of dielectric constant, and at the same time, the crystallization risk of the glass will be increased. Preferably, the weight percentage range of CaO can be 20.0-24.4%%, more preferably 20.0-23.9%.

MgO is an intermediate oxide of the glass, and can regulate the viscosity of glass and control the crystallization of glass. The Mg—O bond is covalent to some extent, but its dominant feature is being ionic. In a network having insufficient "free oxygen", Mg—O bonds have an effect of "accumulation", which helps to reduce the conductivity and dielectric constant of glass. Meanwhile, the ionic radius of $Mg^{2+}$ is smaller than that of either Na⁺ or K⁺, while its ionic field strength is significantly higher, so that the bonding between $Mg^{2+}$ ions and oxygen ions in glass is relatively stronger, which can effectively inhibit the migration of alkali metal ions of Na⁺ and K⁺.

In the electronic-grade glass fiber composition according to this disclosure, the weight percentage range of MgO can be 0.1-1.9%. In this disclosure, a small amount of MgO is used in conjunction with CaO and $Al_2O_3$, so that calcium ions can provide some free oxygen while filling the network gaps, and thus produce a synergistic stacking effect together with magnesium ions and aluminum ions. In this way, a more compact structural accumulation is achieved, and a mixed crystal state consisting of wollastonite ($CaSiO_3$), diopside ($CaMgSi_2O_6$) and feldspar ($CaAl_2Si_2O_8$) is obtained during devitrification of the glass. Thus, the devitrification risk is reduced and dielectric properties of the glass are improved.

Preferably, the weight percentage range of MgO can be 0.45-1.9%, and more preferably can be 0.45-1.6%. In another embodiment of this disclosure, the weight percentage range of MgO can be 0.1-0.9% while the weight percentage range of CaO can be 22.2-24.8%.

In order to improve electrical properties of the glass, control the quantities of non-bridging oxygen, alkali metal ions, boron ions and magnesium ions as well as the competition therebetween, and take into account the raw material cost and glass melting and refining performance, in the electronic-grade glass fiber composition according to this disclosure, the weight percentage ratio $C2=B_2O_3/(R_2O+MgO)$ can be 1.7-6.3. Preferably, the weight percentage ratio C2 can be 1.8-6.1, and more preferably can be 2.0-6.0.

Furthermore, in order to control the quantities of non-bridging oxygen, alkali metal ions and boron ions as well as the competition therebetween in the glass, reduce the dielectric constant and conductivity, and take into account the mechanical properties and raw material cost, the weight percentage ratio $C3=(SiO_2+Al_2O_3)/(B_2O_3+MgO)$ in the present disclosure can be 8.0-16.0. Preferably, the weight percentage ratio C3 can be 9.0-15.0, more preferably 9.5-15.0, and even more preferably 9.5-14.5.

Furthermore, the weight percentage of $SiO_2+Al_2O_3$ in the present disclosure can be 65.0-74.0%, preferably 67.0-74.0%, and more preferably 68.5-74.0%.

Furthermore, in order to improve electrical properties of the glass and acquire a larger temperature range for fiber formation and better crystallization performance, the weight percentage ratio $C4=CaO/(CaO+MgO)$ in the present disclosure can be greater than or equal to 0.915. Preferably, the weight percentage ratio C4 can be greater than or equal to 0.920, more preferably can be 0.920-0.996, and even more preferably can be 0.925-0.995.

Furthermore, the weight percentage of CaO+MgO in the present disclosure can be less than 25%, preferably less than or equal to 24.5%, more preferably can be 20.0-24.5%, and even more preferably can be 20.0-24.0%. Further, the weight percentage of $CaO+MgO+R_2O$ in the present disclosure can be less than or equal to 25.8%, preferably can be 20.5-25.8%, more preferably can be 20.5-25.3%, and even more preferably can be 21.0-24.8%.

Furthermore, in order to improve electrical properties and cost performance of the glass, the weight percentage ratio of $B_2O_3/MgO$ in the present disclosure can be greater than or equal to 2.5, preferably can be 2.5-21.5, and more preferably can be 3.0-20.0.

$TiO_2$ can not only reduce the viscosity of glass at high temperatures, but also has a certain fluxing effect. However, too many $Ti^{4+}$ ions can easily cause ion displacement polarization in a local internal electric field, which leads to the increase of dielectric constant of the glass. In the electronic-grade glass fiber composition according to the present disclosure, the content range of $TiO_2$ can be 0.01-1.0%. Preferably, the content range of $TiO_2$ can be 0.05-0.8%, and more preferably can be 0.05-0.5%.

$Fe_2O_3$ facilitates the melting of glass and can also improve the crystallization performance of glass. In the electronic-grade glass fiber composition according to the present disclosure, the content range of $Fe_2O_3$ can be 0.05-0.8%, preferably 0.05-0.6%. $Fe_2O_3$ contains both Fe' and $Fe^{3+}$ ions, and both of them have certain coloring effect. As $Fe^{3+}$ ions absorb the light in the ultraviolet region and $Fe^{2+}$ ions absorb the light in the infrared region, maintaining an appropriate proportion of ferrous ions in the glass will be good both for heat absorption of the glass liquid when it is heated up and for heat dissipation of the glass liquid when cooled down; it can also strengthen the convection of the glass liquid, improve the cooling and hardening rates of the glass stream when attenuated, reduce the fiber breakage and increase the strength of glass fiber.

Moreover, the tendency of ion displacement polarization of $Fe^{2+}$ is weaker than that of $Fe^{3+}$ ions. Further, the weight percentage ratio of $FeO/Fe_2O_3$ in the present disclosure can be greater than or equal to 0.40. Preferably, the weight percentage ratio of $FeO/Fe_2O_3$ can be greater than or equal to 0.50, more preferably can be 0.50-0.85, and even more preferably can be 0.55-0.80.

$F_2$ is conducive to glass melting and refining and, in combination with iron ions, can produce volatile $FeF_3$ or colorless $Na_3FeF_6$, which would reduce the colorability of glass. A proper amount of fluorine being introduced helps to improve dielectric constant of glass. However, fluorine is volatile and has to be removed from the exhaust gas. In the electronic-grade glass fiber composition according to the present disclosure, the weight percentage range of $F_2$ can be 0.01-1.0%, preferably 0.05-1.0%, and more preferably 0.05-0.8%. In another embodiment of this disclosure, the weight percentage range of $F_2$ can be 0.3-1.0%.

Meanwhile, according to this disclosure, the combined weight percentage of $SiO_2$, $Al_2O_3$, $B_2O_3$, CaO, MgO, $Na_2O$, $K_2O$, $Li_2O$, $TiO_2$, $Fe_2O_3$ and $F_2$ can be greater than or equal to 99%. Preferably, the combined weight percentage of $SiO_2$, $Al_2O_3$, $B_2O_3$, CaO, MgO, $Na_2O$, $K_2O$, $Li_2O$, $TiO_2$, $Fe_2O_3$ and $F_2$ can be greater than or equal to 99.5%, and more preferably can be greater than or equal to 99.8%. In addition to the above-mentioned main components, the composition according to the present disclosure can also contain a small amount of other components.

Further, the composition according to the present disclosure contains one or more components selected from the group consisting of $SO_3$, SrO, $CeO_2$, $La_2O_3$, $Y_2O_3$, $ZrO_2$ and ZnO, and the total amount of $SO_3$, SrO, $CeO_2$, $La_2O_3$, $Y_2O_3$, $ZrO_2$ and ZnO is less than 1% by weight percentage. Further, the total amount of $SO_3$, SrO, $CeO_2$, $La_2O_3$, $Y_2O_3$, $ZrO_2$ and ZnO is less than 0.5% by weight percentage. Further, the composition contains less than 0.5% in percentage amount by weight of $SO_3$. In addition, in another embodiment of this disclosure, the composition is substantially free of $P_2O_5$ in order to control production cost and improve environmental protection. In still another embodiment of this disclosure, the composition is substantially free of SrO so as to control production cost and glass density.

In addition, the expression "substantially free of" concerning a certain component in the description of this disclosure means the component exists in the composition only in trace amount, for example in the form of trace impurities unintentionally introduced with a glass raw material. The weight percentage of this component in the composition is 0-0.03%, and in most cases 0-0.01%.

Furthermore, a dielectric constant of the electronic-grade glass fiber according to the present disclosure is 6.0-7.0 at 1 MHz and room temperature. Preferably, the dielectric constant is 6.3-7.0, and more preferably, the dielectric constant is 6.3-6.8.

In the electronic-grade glass fiber composition according to the present disclosure, the beneficial effects produced by the aforementioned selected ranges of the components will be explained by way of examples through the specific experimental data.

The following are examples of preferred content ranges of the components contained in the electronic-grade glass fiber composition according to the present disclosure.

Preferred Example 1

The electronic-grade glass fiber composition according to the present disclosure comprises the following components expressed as percentage amounts by weight:

| | |
|---|---|
| $SiO_2$ | 51.0-57.5% |
| Al2O3 | 11.0-17.0% |
| B2O3 | >4.5% and <6.4% |
| CaO | 19.5-24.8% |
| MgO | 0.1-1.9% |
| R2O=Na2O+K2O+Li2O | 0.05-1.2% |
| Fe2O3 | 0.05-0.8% |
| TiO2 | 0.01-1.0% |
| $F_2$ | 0.01-1.0% | wherein, the weight percentage ratio $C1=SiO_2/B_2O_3$ is 8.3-12.5, the weight percentage ratio $C2=B_2O_3/(R_2O+MgO)$ is 1.7-6.3, and the total weight percentage of the above components is greater than or equal to 99%.

Preferred Example 2

The electronic-grade glass fiber composition according to the present disclosure comprises the following components expressed as percentage amounts by weight:

| | |
|---|---|
| $SiO_2$ | 52.0-57.0% |
| Al2O3 | 12.0-16.0% |
| B2O3 | >4.5% and <6.4% |
| CaO | 20.0-24.4% |
| MgO | 0.45-1.9% |
| R2O=Na2O+K2O+Li2O | 0.05-0.95% |
| Fe2O3 | 0.05-0.8% |
| TiO2 | 0.01-1.0% |
| $F_2$ | 0.01-1.0% | wherein, the weight percentage ratio $C1=SiO_2/B_2O_3$ is 8.1-12.7, the weight percentage ratio $C2=B_2O_3/(R_2O+MgO)$ is 1.7-6.3, and the total weight percentage of the above components is greater than or equal to 99%.

Preferred Example 3

The electronic-grade glass fiber composition according to the present disclosure comprises the following components expressed as percentage amounts by weight:

| | |
|---|---|
| $SiO_2$ | 52.0-55.9% |
| Al2O3 | 11.0-17.0% |
| B2O3 | 5.1-6.4% |
| CaO | 19.5-24.8% |
| MgO | 0.1-1.9% |
| R2O=Na2O+K2O+Li2O | 0.05-0.95% |
| Fe2O3 | 0.05-0.8% |
| TiO2 | 0.01-1.0% |
| F2 | 0.01-1.0% | wherein, the weight percentage ratio $C1=SiO_2/B_2O_3$ is 8.1-12.7, the weight percentage ratio $C2=B_2O_3/(R_2O+MgO)$ is 1.7-6.3, the weight percentage ratio $C3=(SiO_2+Al_2O_3)/(B_2O_3+MgO)$ is 9.5-15.0, and the total weight percentage of the above components is greater than or equal to 99%.

Preferred Example 4

The electronic-grade glass fiber composition according to the present disclosure comprises the following components expressed as percentage amounts by weight:

| | |
|---|---|
| $SiO_2$ | 51.0-57.5% |
| Al2O3 | 11.0-17.0% |
| B2O3 | >4.5% and <6.4% |
| CaO | 22.2-24.8% |
| MgO | 0.1-0.9% |
| R2O=Na2O+K2O+Li2O | 0.05-1.2% |
| Fe2O3 | 0.05-0.8% |
| TiO2 | 0.01-1.0% |
| $F_2$ | 0.01-1.0% | wherein, the weight percentage ratio $C1=SiO_2/B_2O_3$ is 8.1-12.7, the weight percentage ratio $C2=B_2O_3/(R_2O+MgO)$ is 1.7-6.3, and the total weight percentage of the above components is greater than or equal to 99%.

Preferred Example 5

The electronic-grade glass fiber composition according to the present disclosure comprises the following components expressed as percentage amounts by weight:

| | |
|---|---|
| $SiO_2$ | 54.2-57.5% |
| Al2O3 | 11.0-17.0% |
| B2O3 | >4.5% and <6.4% |

-continued

| | |
|---|---|
| CaO | 19.5-24.8% |
| MgO | 0.1-1.9% |
| R2O=Na2O+K2O+Li2O | 0.05-1.2% |
| Fe2O3 | 0.05-0.8% |
| TiO2 | 0.01-1.0% |
| F2 | 0.3-1.0% | wherein, the weight percentage ratio $C1=SiO_2/B_2O_3$ is 8.5-12.5, the weight percentage ratio $C2=B_2O_3/(R_2O+MgO)$ is 1.7-6.3, and the total weight percentage of the above components is greater than or equal to 99%.

Preferred Example 6

The electronic-grade glass fiber composition according to the present disclosure comprises the following components expressed as percentage amounts by weight:

| | |
|---|---|
| SiO2 | 51.0-57.5% |
| Al2O3 | 11.0-17.0% |
| B2O3 | 4.55-6.4% |
| CaO | 19.5-24.8% |
| MgO | 0.45-1.9% |
| R2O=Na2O+K2O+Li2O | 0.05-1.2% |
| Fe2O3 | 0.05-0.8% |
| TiO2 | 0.01-1.0% |
| $F_2$ | 0.01-1.0% | wherein, the weight percentage ratio $C1=SiO_2/B_2O_3$ is 8.3-12.5, the weight percentage ratio $C2=B_2O_3/(R_2O+MgO)$ is 1.7-6.3, the weight percentage ratio $C3=(SiO_2+Al_2O_3)/(B_2O_3+MgO)$ is 9.5-15.0, the weight percentage ratio $C4=CaO/(CaO+MgO)$ is greater than or equal to 0.915, and the total weight percentage of the above components is greater than or equal to 99%.

Preferred Example 7

The electronic-grade glass fiber composition according to the present disclosure comprises the following components expressed as percentage amounts by weight:

| | |
|---|---|
| SiO2 | 52.0-57.0% |
| Al2O3 | 12.0-16.0% |
| B2O3 | >4.5% and <6.4% |
| CaO | 20.0-24.4% |
| MgO | 0.45-1.9% |
| R2O=Na2O+K2O+Li2O | 0.05-0.95% |
| Fe2O3 | 0.05-0.8% |
| TiO2 | 0.01-1.0% |
| $F_2$ | 0.01-1.0% | wherein, the weight percentage ratio $C1=SiO_2/B_2O_3$ is 8.3-12.5, the weight percentage ratio $C2=B_2O_3/(R_2O+MgO)$ is 1.8-6.1, the weight percentage ratio $C3=(SiO_2+Al_2O_3)/(B_2O_3+MgO)$ is 9.5-15.0, and the total weight percentage of the above components is greater than or equal to 99%.

Preferred Example 8

The electronic-grade glass fiber composition according to the present disclosure comprises the following components expressed as percentage amounts by weight:

| | |
|---|---|
| SiO2 | 52.0-57.0% |
| Al2O3 | 12.0-16.0% |
| B2O3 | 4.55-6.4% |
| CaO | 20.0-24.4% |
| MgO | 0.1-1.9% |
| R2O=Na2O+K2O+Li2O | 0.05-0.95% |
| Fe2O3 | 0.05-0.8% |
| TiO2 | 0.01-1.0% |
| F2 | 0.01-1.0% | wherein, the weight percentage ratio $C1=SiO_2/B_2O_3$ is 8.3-12.5, the weight percentage ratio $C2=B_2O_3/(R_2O+MgO)$ is 1.8-6.1, the weight percentage ratio $C3=(SiO_2+Al_2O_3)/(B_2O_3+MgO)$ is 9.5-15.0, the weight percentage ratio $C4=CaO/(CaO+MgO)$ is greater than or equal to 0.915, and the total weight percentage of the above components is greater than or equal to 99%.

Preferred Example 9

The electronic-grade glass fiber composition according to the present disclosure comprises the following components expressed as percentage amounts by weight:

| | |
|---|---|
| SiO2 | 52.0-57.0% |
| Al2O3 | 12.0-16.0% |
| B2O3 | 4.55-6.4% |
| CaO | 20.0-24.4% |
| MgO | 0.45-1.9% |
| R2O=Na2O+K2O+Li2O | 0.1-0.8% |
| Fe2O3 | 0.05-0.8% |
| $TiO_2$ | 0.05-0.8% |
| F2 | 0.05-0.8% | wherein, the weight percentage ratio $C1=SiO_2/B_2O_3$ is 8.3-12.5, the weight percentage ratio $C2=B_2O_3/(R_2O+MgO)$ is 1.8-6.1, the weight percentage ratio $C3=(SiO_2+Al_2O_3)/(B_2O_3+MgO)$ is 9.5-15.0, the weight percentage ratio $C4=CaO/(CaO+MgO)$ is greater than or equal to 0.920, and the total weight percentage of the above components is greater than or equal to 99%.

DETAILED DESCRIPTION OF THE EMBODIMENTS

In order to better clarify the purposes, technical solutions and advantages of the examples of the present disclosure, the technical solutions in the examples of the present disclosure are clearly and completely described below. Obviously, the examples described herein are just part of the examples of the present disclosure and are not all the examples. All other exemplary embodiments obtained by one skilled in the art on the basis of the examples in the present disclosure without performing creative work shall all fall into the scope of the present disclosure. What needs to be made clear is that, as long as there is no conflict, the examples and the features of examples in the present application can be arbitrarily combined with each other.

In the present disclosure, the components of the electronic-grade glass fiber composition expressed as percentage amounts by weight are: 51.0-57.5% $SiO_2$, 11.0-17.0% $Al_2O_3$, greater than 4.5% and less than or equal to 6.4% $B_2O_3$, 19.5-24.8% CaO, 0.1-1.9% MgO, 0.05-1.2% $R_2O=Na_2O+K_2O+Li_2O$, 0.05-0.8% $Fe_2O_3$, 0.01-1.0% $TiO_2$, and 0.01-1.0% $F_2$; wherein the range of the weight percentage ratio $C1=SiO_2/B_2O_3$ is 8.1-12.7, the range of the weight percentage ratio $C2=B_2O_3/(R_2O+MgO)$ is 1.7-6.3, and the total weight percentage of the above components is greater than or equal to 99%. The composition has the advantage of high cost performance. It can reduce the cost and volatilization of raw materials, improve dielectric properties of the glass, increase mechanical properties and water resistance, and improve temperature range for fiber formation. The composition is suitable for large-scale tank furnace production.

The specific content values of $SiO_2$, $Al_2O_3$, $B_2O_3$, CaO, MgO, $Na_2O$, $K_2O$, $Li_2O$, $TiO_2$, $Fe_2O_3$ and $F_2$ in the electronic-grade glass fiber composition according to the present disclosure are selected to be used in the examples, which are compared with the properties of five comparative examples (numbered B1-B5) in terms of the following eight property parameters, with B1 being a conventional E-glass fiber composition for electronic applications, B2 being a conventional D-glass fiber composition and B3-B5 being general-purpose E-glass fiber compositions for reinforcement.

(1) Forming temperature, the temperature at which the glass melt has a viscosity of $10^3$ poise.

(2) Liquidus temperature, the temperature at which the crystal nucleuses begin to form when the glass melt cools off—i.e., the upper limit temperature for glass crystallization.

(3) ΔT value, which is the difference between the forming temperature and the liquidus temperature and indicates the temperature range at which fiber drawing can be performed.

(4) Tensile strength, the maximum tensile stress that the glass fiber can withstand, which can be measured on impregnated glass roving according to ASTM D2343.

(5) Dielectric constant, to be determined in a procedure as follows: Mix the glass-making raw materials well and then add them to a platinum crucible; hold the crucible in a high-temperature electric furnace and at 1550±30° C. for 6 hours to obtain a well refined and homogenized glass liquid; pour the glass liquid into a preheated stainless steel mold to make glass blocks, hold these glass blocks in a muffle furnace for annealing, and then cut, sand and polish the annealed glass blocks to make rectangular glass pieces with a thickness of about 1.5 mm and a length and width each of about 30 mm; and coat the glass pieces with silver to form electrodes and then test these pieces to obtain dielectric constant values. A smaller dielectric constant means a weaker polarization of the glass medium and a better insulation of the glass, and vice versa.

(6) Amount of bubbles, to be determined in a procedure as follows: Use special molds to compress the glass batch materials in each example into samples of same dimension, which will then be placed on the sample platform of a high temperature microscope. Heat the samples according to standard procedures up to the pre-set spatial temperature 1500° C., and then the glass samples is directly cooled off with the cooling hearth of the microscope to the ambient temperature without heat preservation. Finally, each of the glass samples is examined under a polarizing microscope to determine the amount of bubbles in the samples. Wherein, the amount of bubbles is identified according to a specific amplification of the microscope.

(7) Water resistance, to be characterized in terms of weight loss rate. The test procedure is as follows: Put the glass powder with a particle size of 40-80 mesh into water at 95° C. for 24 hours, stir the mixture at regular intervals, and measure and determine the weight loss rate of the glass powder. A smaller weight loss rate means a better water resistance of the glass, and vice versa.

(8) Raw material cost coefficient. Set the cost of the conventional E-glass fiber composition B1 as the benchmark, its cost coefficient being 1.0. The costs of other compositions are calculated in comparison with the benchmark. A smaller cost coefficient of raw materials means a lower cost of the composition, and vice versa The aforementioned eight parameters and the methods of measuring them are well-known to one skilled in the art. Therefore, these parameters can be effectively used to explain the technical features and advantages of the electronic-grade glass fiber composition according to the present disclosure.

The specific procedures for the experiments are as follows: Each component can be acquired from the appropriate raw materials. Mix the raw materials in the appropriate proportions so that each component reaches the final expected weight percentage. The mixed batch melts and the molten glass refines. Then the molten glass is drawn out through the tips of the bushings, thereby forming the glass fiber. The glass fiber is attenuated onto the rotary collet of a winder to form cakes or packages. Of course, conventional methods can be used to further process these glass fibers to meet the expected requirement.

Comparisons of the property parameters of the examples of the electronic-grade glass fiber composition according to the present disclosure with those of the comparative examples are further made below by way of tables, where the component contents of the compositions for producing glass fiber are expressed as weight percentage. What needs to be made clear is that the total amount of the components in an example is slightly less than 100%, and it should be understood that the remaining amount is trace impurities or a small amount of components which cannot be analyzed.

TABLE 1A

| | | A1 | A2 | A3 | A4 | A5 |
|---|---|---|---|---|---|---|
| Component | $SiO_2$ | 54.70 | 54.70 | 54.20 | 54.70 | 55.50 |
| | $Al_2O_3$ | 14.50 | 14.50 | 14.50 | 14.50 | 14.50 |
| | CaO | 23.35 | 23.00 | 23.00 | 23.00 | 22.35 |
| | MgO | 0.50 | 0.50 | 0.50 | 0.50 | 1.00 |
| | $B_2O_3$ | 5.30 | 5.65 | 5.65 | 5.65 | 4.55 |
| | $TiO_2$ | 0.30 | 0.30 | 0.30 | 0.30 | 0.30 |
| | $Fe_2O_3$ | 0.30 | 0.30 | 0.30 | 0.30 | 0.30 |
| | $K_2O$ | 0.30 | 0.30 | 0.30 | 0.30 | 0.30 |
| | $Na_2O$ | 0.30 | 0.15 | 0.30 | 0.25 | 0.20 |
| | $F_2$ | 0.35 | 0.50 | 0.35 | 0.35 | 0.80 |
| | $Li_2O$ | — | — | — | 0.05 | — |
| | $ZrO_2$ | — | — | 0.50 | — | — |
| Ratio | C1 | 10.32 | 9.68 | 9.59 | 9.68 | 12.20 |
| | C2 | 4.82 | 5.95 | 5.14 | 5.14 | 3.03 |
| | C3 | 11.93 | 11.25 | 11.17 | 11.25 | 12.61 |
| | C4 | 0.979 | 0.979 | 0.979 | 0.979 | 0.957 |

TABLE 1A-continued

| | | A1 | A2 | A3 | A4 | A5 |
|---|---|---|---|---|---|---|
| Parameter | Forming temperature/° C. | 1193 | 1192 | 1196 | 1187 | 1198 |
| | Liquidus temperature/° C. | 1082 | 1080 | 1082 | 1076 | 1084 |
| | ΔT/° C. | 111 | 112 | 114 | 111 | 114 |
| | Tensile strength/MPa | 2130 | 2110 | 2160 | 2200 | 2150 |
| | Dielectric constant | 6.70 | 6.65 | 6.60 | 6.75 | 6.75 |
| | Amount of bubbles/pcs | 6 | 7 | 10 | 6 | 8 |
| | Water resistance, in weight loss rate/% | 0.50 | 0.45 | 0.45 | 0.55 | 0.50 |
| | Raw materials cost coefficient | 0.79 | 0.80 | 0.84 | 0.83 | 0.78 |

TABLE 1B

| | | A6 | A7 | A8 | A9 | A10 |
|---|---|---|---|---|---|---|
| Component | $SiO_2$ | 54.20 | 56.50 | 53.00 | 54.00 | 54.60 |
| | $Al_2O_3$ | 15.00 | 12.70 | 17.00 | 16.00 | 14.60 |
| | CaO | 22.80 | 21.50 | 22.20 | 22.20 | 23.00 |
| | MgO | 0.50 | 1.50 | 0.65 | 0.65 | 0.65 |
| | $B_2O_3$ | 6.10 | 6.10 | 5.45 | 5.45 | 5.45 |
| | $TiO_2$ | 0.40 | 0.25 | 0.25 | 0.25 | 0.25 |
| | $Fe_2O_3$ | 0.25 | 0.25 | 0.40 | 0.40 | 0.40 |
| | $K_2O$ | 0.30 | 0.40 | 0.30 | 0.30 | 0.30 |
| | $Na_2O$ | 0.30 | 0.40 | 0.25 | 0.25 | 0.25 |
| | $F_2$ | 0.05 | 0.30 | 0.40 | 0.40 | 0.40 |
| Ratio | C1 | 8.89 | 9.26 | 9.72 | 9.91 | 10.02 |
| | C2 | 5.55 | 2.65 | 4.54 | 4.54 | 4.54 |
| | C3 | 10.48 | 9.11 | 11.48 | 11.48 | 11.34 |
| | C4 | 0.979 | 0.935 | 0.972 | 0.972 | 0.973 |
| Parameter | Forming temperature/° C. | 1195 | 1192 | 1197 | 1198 | 1192 |
| | Liquidus temperature/° C. | 1083 | 1079 | 1086 | 1083 | 1081 |
| | ΔT/° C. | 112 | 113 | 111 | 115 | 111 |
| | Tensile strength/MPa | 2150 | 2120 | 2130 | 2160 | 2130 |
| | Dielectric constant | 6.60 | 6.70 | 6.75 | 6.70 | 6.75 |
| | Amount of bubbles/pcs | 6 | 6 | 9 | 7 | 6 |
| | Water resistance, in weight loss rate/% | 0.50 | 0.55 | 0.45 | 0.45 | 0.50 |
| | Raw materials cost coefficient | 0.80 | 0.81 | 0.80 | 0.79 | 0.79 |

TABLE 1C

| | | A11 | A12 | A13 | A14 | A15 |
|---|---|---|---|---|---|---|
| Component | $SiO_2$ | 54.80 | 55.50 | 55.00 | 55.00 | 55.00 |
| | $Al_2O_3$ | 14.40 | 14.40 | 14.70 | 14.70 | 14.70 |
| | CaO | 22.30 | 23.00 | 21.45 | 22.45 | 23.15 |
| | MgO | 0.55 | 0.55 | 1.90 | 0.90 | 0.20 |
| | $B_2O_3$ | 6.10 | 4.70 | 5.10 | 5.10 | 5.10 |
| | $TiO_2$ | 0.35 | 0.35 | 0.35 | 0.35 | 0.35 |
| | $Fe_2O_3$ | 0.35 | 0.35 | 0.30 | 0.30 | 0.30 |
| | $K_2O$ | 0.30 | 0.30 | 0.30 | 0.30 | 0.30 |
| | $Na_2O$ | 0.30 | 0.30 | 0.35 | 0.35 | 0.35 |
| | $F_2$ | 0.45 | 0.45 | 0.45 | 0.45 | 0.45 |
| Ratio | C1 | 8.98 | 11.81 | 10.78 | 10.78 | 10.78 |
| | C2 | 5.30 | 4.09 | 2.00 | 3.29 | 6.00 |
| | C3 | 10.41 | 13.31 | 9.96 | 11.62 | 13.15 |
| | C4 | 0.976 | 0.977 | 0.919 | 0.961 | 0.991 |

TABLE 1C-continued

|  |  | A11 | A12 | A13 | A14 | A15 |
|---|---|---|---|---|---|---|
| Parameter | Forming temperature/° C. | 1192 | 1198 | 1198 | 1195 | 1194 |
|  | Liquidus temperature/° C. | 1079 | 1084 | 1088 | 1080 | 1083 |
|  | ΔT/° C. | 113 | 114 | 110 | 115 | 111 |
|  | Tensile strength/MPa | 2110 | 2180 | 2160 | 2150 | 2130 |
|  | Dielectric constant | 6.65 | 6.80 | 6.75 | 6.70 | 6.70 |
|  | Amount of bubbles/pcs | 5 | 7 | 9 | 7 | 6 |
|  | Water resistance, in weight loss rate/% | 0.55 | 0.50 | 0.50 | 0.55 | 0.55 |
|  | Raw materials cost coefficient | 0.81 | 0.77 | 0.79 | 0.78 | 0.78 |

TABLE 1D

|  |  | A16 | A17 | A18 | A19 | A20 |
|---|---|---|---|---|---|---|
| Component | $SiO_2$ | 54.40 | 54.40 | 55.90 | 55.00 | 54.40 |
|  | $Al_2O_3$ | 14.55 | 14.55 | 14.55 | 14.55 | 14.55 |
|  | CaO | 22.55 | 24.40 | 21.65 | 22.55 | 23.15 |
|  | MgO | 0.45 | 0.45 | 0.45 | 0.45 | 0.45 |
|  | $B_2O_3$ | 6.40 | 4.55 | 5.80 | 5.80 | 5.80 |
|  | $TiO_2$ | 0.35 | 0.35 | 0.35 | 0.35 | 0.35 |
|  | $Fe_2O_3$ | 0.30 | 0.30 | 0.30 | 0.30 | 0.30 |
|  | $K_2O$ | 0.30 | 0.30 | 0.30 | 0.30 | 0.30 |
|  | $Na_2O$ | 0.30 | 0.15 | 0.30 | 0.30 | 0.30 |
|  | $F_2$ | 0.30 | 0.45 | 0.30 | 0.30 | 0.30 |
| Ratio | C1 | 8.50 | 11.96 | 9.64 | 9.48 | 9.38 |
|  | C2 | 6.10 | 5.06 | 5.52 | 5.52 | 5.52 |
|  | C3 | 10.07 | 13.79 | 11.27 | 11.13 | 11.03 |
|  | C4 | 0.980 | 0.982 | 0.980 | 0.980 | 0.981 |
| Parameter | Forming temperature/° C. | 1193 | 1194 | 1203 | 1198 | 1192 |
|  | Liquidus temperature/° C. | 1078 | 1083 | 1090 | 1084 | 1080 |
|  | ΔT/° C. | 115 | 111 | 113 | 114 | 112 |
|  | Tensile strength/MPa | 2080 | 2160 | 2160 | 2130 | 2100 |
|  | Dielectric constant | 6.60 | 6.80 | 6.65 | 6.70 | 6.75 |
|  | Amount of bubbles/pcs | 6 | 7 | 9 | 7 | 6 |
|  | Water resistance, in weight loss rate/% | 0.60 | 0.50 | 0.50 | 0.55 | 0.55 |
|  | Raw materials cost coefficient | 0.82 | 0.76 | 0.80 | 0.80 | 0.81 |

TABLE 1E

|  |  | B1 | B2 | B3 | B4 | B5 |
|---|---|---|---|---|---|---|
| Component | $SiO_2$ | 54.16 | 73.00 | 59.05 | 56.50 | 54.00 |
|  | $Al_2O_3$ | 14.32 | 1.00 | 13.08 | 14.70 | 15.20 |
|  | CaO | 22.12 | 0.60 | 24.29 | 22.50 | 24.00 |
|  | MgO | 0.41 | 0.50 | 2.83 | 4.00 | 2.10 |
|  | $B_2O_3$ | 7.26 | 22.00 | 0 | 0.50 | 2.50 |
|  | $TiO_2$ | 0.34 | 0 | 0.04 | 0.25 | 0.25 |
|  | $Fe_2O_3$ | 0.39 | 0 | 0.36 | 0.30 | 0.30 |
|  | $K_2O$ | 0.25 | 2.90 | 0.23 | 0.35 | 0.40 |
|  | $Na_2O$ | 0.45 |  | 0.03 | 0.55 | 0.90 |
|  | $F_2$ | 0.29 | 0 | 0.04 | 0.25 | 0.25 |
| Ratio | C1 | 7.46 | 3.32 | — | 113.00 | 21.60 |
|  | C2 | 6.54 | 6.47 | 0 | 0.10 | 0.74 |
|  | C3 | 8.93 | 3.29 | 25.49 | 15.82 | 15.04 |
|  | C4 | 0.982 | 0.545 | 0.896 | 0.849 | 0.920 |

TABLE 1E-continued

|  |  | B1 | B2 | B3 | B4 | B5 |
|---|---|---|---|---|---|---|
| Parameter | Forming temperature/° C. | 1175 | 1410 | 1248 | 1240 | 1215 |
|  | Liquidus temperature/° C. | 1075 | 1250 | 1169 | 1190 | 1185 |
|  | ΔT/° C. | 100 | 160 | 79 | 50 | 30 |
|  | Tensile strength/ MPa | 1982 | 1870 | 2290 | 2180 | 2050 |
|  | Dielectric constant | 6.80 | 4.20 | 7.25 | 7.30 | 7.40 |
|  | Amount of bubbles/pcs | 10 | 20 | 18 | 10 | 7 |
|  | Water resistance, in weight loss rate/% | 0.80 | 1.80 | 0.35 | 0.55 | 0.80 |
|  | Raw materials cost coefficient | 1.00 | 2.00 | 0.51 | 0.56 | 0.70 |

It can be seen from the values in the above tables that, compared with the compositions of general-purpose E-glass fiber for reinforcement, the electronic-grade glass fiber composition according to the present disclosure has the following advantages: (1) lower dielectric constant; (2) lower forming temperature and lower liquidus temperature; and (3) wider temperature range for fiber formation.

Compared with the composition of the conventional E-glass fiber, the electronic-grade glass fiber composition according to the present disclosure has the following advantages: (1) lower raw material cost; (2) higher tensile strength and better water resistance; (3) wider temperature range for fiber formation; and (4) improved dielectric constant levels.

Compared with the composition of the conventional D-glass fiber, the electronic-grade glass fiber composition according to the present disclosure has the following advantages: (1) much lower raw material cost; (2) much higher tensile strength; (3) much better water resistance; and (4) smaller amount of bubbles.

Therefore, it can be seen from the above that, compared with the compositions of general-purpose E-glass fiber for reinforcement, conventional E-glass fiber and conventional D-glass fiber, the electronic-grade glass fiber composition according to the present disclosure has made a breakthrough in terms of cost performance of products, raw material cost, dielectric constant, tensile strength, liquidus temperature, temperature range for fiber formation, and water resistance. With unexpected technical effects, the composition enables an easy achievement of large-scale tank furnace production.

The electronic-grade glass fiber composition according to the present disclosure can be used for making glass fibers for electronic applications having the aforementioned properties. The glass fibers can then be used for making electronic fabrics.

The electronic-grade glass fiber composition according to the present disclosure in combination with one or more organic and/or inorganic materials can be used for preparing composite materials having excellent performance, such as glass fiber reinforced base materials.

It is to be noted that, in this text, the terms "comprise/ comprising", "contain/containing" or any other variants thereof are non-exclusive, so that any process, method, object or device containing a series of elements contains not only such factors, but also other factors not listed clearly, or further contains inherent factors of the process, method, object or device. Without further restrictions, a factor defined by the statement "comprises/comprising an/a . . . ", "contain/containing an/a . . . " or any other variants thereof does not exclude other identical factors in the process, method, object or device including said factors.

The foregoing embodiments are provided only for describing instead of limiting the technical solutions of the present disclosure. While particular embodiments of the disclosure have been shown and described, it will be obvious to those skilled in the art that modifications can be made to the technical solutions embodied by all the aforementioned embodiments, or that equivalent replacements can be made to some of the technical features embodied by all the aforementioned embodiments, without departing from the spirit and scope of the technical solutions of the present disclosure.

INDUSTRIAL APPLICABILITY

The electronic-grade glass fiber composition according to the present disclosure can reduce the cost and volatilization of raw materials and lower corrosion to refractories. It can also improve dielectric properties of the glass, increase mechanical properties and water resistance of the glass fiber, and improve temperature range for fiber formation. Thus, the composition is suitable for large-scale tank furnace production.

Compared with conventional glass fiber compositions, the electronic-grade glass fiber composition according to the present disclosure has made a breakthrough in terms of cost performance of products, raw material cost, dielectric constant, tensile strength, liquidus temperature, temperature range for fiber formation, and water resistance.

Therefore, the present disclosure has good industrial applicability.

The invention claimed is:

1. An electronic-grade glass fiber composition, comprising the following components with corresponding amounts by weight percentage:

| | |
|---|---|
| $SiO_2$ | 51.0-57.5% |
| $Al_2O_3$ | 11.0-17.0% |
| $B_2O_3$ | >4.5% and ≤6.1% |
| CaO | 19.5-24.8% |
| MgO | 0.1-1.9% |
| $R_2O = Na_2O + K_2O + Li_2O$ | 0.05-1.2% |
| $Fe_2O_3$ | 0.05-0.8% |
| $TiO_2$ | 0.01-1.0% |
| $F_2$ | 0.01-1.0% | wherein a weight percentage ratio $C1 = SiO_2/B_2O_3$ is 9.38-12.7, a weight percentage ratio $C2 = B_2O_3/(R_2O + MgO)$ is 1.7-6.3, and a total weight percentage of the above components is greater than or equal to 99%.

2. The electronic-grade glass fiber composition of claim 1, wherein a weight percentage of $Li_2O$ is less than 0.1%.

3. The electronic-grade glass fiber composition of claim 1, wherein a weight percentage of $B_2O_3$ is 4.55-6.1%.

4. The electronic-grade glass fiber composition of claim 1, wherein a weight percentage of $F_2$ is 0.3-1.0%.

5. The electronic-grade glass fiber composition of claim 1, wherein a weight percentage of MgO is 0.45-1.9%.

6. The electronic-grade glass fiber composition of claim 1, wherein a weight percentage of CaO is 22.2-24.8%.

7. The electronic-grade glass fiber composition of claim 1, further comprising one or more components selected form the group consisting of $SO_3$, SrO, $CeO_2$, $La_2O_3$, $Y_2O_3$, $ZrO_2$ and ZnO, with a combined weight percentage of the one or more components being less than 1%.

8. The electronic-grade glass fiber composition of claim 1, wherein a weight percentage of $R_2O$ is 0.1-0.8%.

9. The electronic-grade glass fiber composition of claim 1, wherein a combined weight percentage of $B_2O_3$+MgO is 5.0-7.6%.

10. The electronic-grade glass fiber composition of claim 1, wherein a combined weight percentage of $SiO_2$+$Al_2O_3$ is 68.5-74.0%.

11. The electronic-grade glass fiber composition of claim 1, wherein a combined weight percentage of CaO+MgO+$R_2O$ is 20.5-25.8%.

12. The electronic-grade glass fiber composition of claim 1, wherein a weight percentage ratio C3=($SiO_2$+$Al_2O_3$)/($B_2O_3$+MgO) is 9.0-15.0.

13. The electronic-grade glass fiber composition of claim 1, wherein a weight percentage ratio C4=CaO/(CaO+MgO) is greater than or equal to 0.915.

14. The electronic-grade glass fiber composition of claim 1, comprising the following components with corresponding amounts by weight percentages:

| | |
|---|---|
| $SiO_2$ | 51.0-57.5% |
| Al2O3 | 11.0-17.0% |
| B2O3 | >4.5% and ≤6.1% |
| CaO | 19.5-24.8% |
| MgO | 0.1-1.9% |
| R2O=Na2O+K2O+Li2O | 0.05-1.2% |
| Fe2O3 | 0.05-0.8% |
| $TiO_2$ | 0.01-1.0% |
| $F_2$ | 0.01-1.0% | wherein the weight percentage ratio C1=$SiO_2$/$B_2O_3$ is 9.38-12.7, the weight percentage ratio C2=$B_2O_3$/($R_2O$+MgO) is 1.7-6.3, a weight percentage ratio C3=($SiO_2$+$Al_2O_3$)/($B_2O_3$+MgO) is 9.0-15.0, a weight percentage ratio C4=CaO/(CaO+MgO) is greater than or equal to 0.915, and a total weight percentage of the above components is greater than or equal to 99%.

15. The electronic-grade glass fiber composition of claim 1, comprising the following components with corresponding amounts by weight percentages:

| | |
|---|---|
| $SiO_2$ | 52.0-57.0% |
| Al2O3 | 12.0-16.0% |
| B2O3 | >4.5% and ≤6.1% |
| CaO | 20.0-24.4% |
| MgO | 0.1-1.9% |
| R2O=Na2O+K2O+Li2O | 0.05-1.2% |
| Fe2O3 | 0.05-0.8% |
| $TiO_2$ | 0.01-1.0% |
| $F_2$ | 0.01-1.0% | wherein the weight percentage ratio C1=$SiO_2$/$B_2O_3$ is 9.38-12.5, the weight percentage ratio C2=$B_2O_3$/($R_2O$+MgO) is 1.7-6.3, and a total weight percentage of the above components is greater than or equal to 99%.

16. The electronic-grade glass fiber composition of claim 1, comprising the following components with corresponding amounts by weight percentages:

| | |
|---|---|
| $SiO_2$ | 52.0-57.0% |
| Al2O3 | 12.0-16.0% |
| B2O3 | >4.5% and ≤6.1% |
| CaO | 20.0-24.4% |
| MgO | 0.1-1.9% |
| R>O=Na>O+K>O+LiO | 0.05-0.95% |
| Fe2O3 | 0.05-0.8% |
| TiO2 | 0.05-0.8% |
| F2 | 0.05-0.8% | wherein the weight percentage ratio C1=$SiO_2$/$B_2O_3$ is 9.38-12.5, the weight percentage ratio C2=$B_2O_3$/($R_2O$+MgO) is 1.7-6.3, a weight percentage ratio C3=($SiO_2$+$Al_2O_3$)/($B_2O_3$+MgO) is 9.0-15.0, a weight percentage ratio C4=CaO/(CaO+MgO) is greater than or equal to 0.915, and a total weight percentage of the above components is greater than or equal to 99%.

17. An electronic-grade glass fiber, being produced using the composition of claim 1.

18. The electronic-grade glass fiber of claim 17, having a dielectric constant of 6.3-7.0 at 1 MHz at room temperature.

19. An electronic fabric, comprising the glass fiber of claim 17.

20. The electronic fabric of claim 19, being used as a base material for printed circuit boards.

* * * * *